United States Patent
Kasai et al.

(10) Patent No.: US 11,004,465 B2
(45) Date of Patent: May 11, 2021

(54) MAGNETO-RESISTANCE ELEMENT IN WHICH I-III-VI2 COMPOUND SEMICONDUCTOR IS USED, METHOD FOR MANUFACTURING SAID MAGNETO-RESISTANCE ELEMENT, AND MAGNETIC STORAGE DEVICE AND SPIN TRANSISTOR IN WHICH SAID MAGNETO-RESISTANCE ELEMENT IS USED

(71) Applicant: NATIONAL INSTITUTE FOR MATERIALS SCIENCE, Ibaraki (JP)

(72) Inventors: Shinya Kasai, Ibaraki (JP); Yukiko Takahashi, Ibaraki (JP); Pohan Cheng, Ibaraki (JP); Ikhtiar, Ibaraki (JP); Seiji Mitani, Ibaraki (JP); Tadakatsu Ohkubo, Ibaraki (JP); Kazuhiro Hono, Ibaraki (JP)

(73) Assignee: NATIONAL INSTITUTE FOR MATERIALS SCIENCE, Ibaraki (JP)

( * ) Notice: Subject to any disclaimer, the term of this patent is extended or adjusted under 35 U.S.C. 154(b) by 128 days.

(21) Appl. No.: 16/311,367

(22) PCT Filed: Jun. 23, 2017

(86) PCT No.: PCT/JP2017/023140
§ 371 (c)(1),
(2) Date: Dec. 19, 2018

(87) PCT Pub. No.: WO2017/222038
PCT Pub. Date: Dec. 28, 2017

(65) Prior Publication Data
US 2019/0237099 A1    Aug. 1, 2019

(30) Foreign Application Priority Data
Jun. 24, 2016  (JP) .............................. JP2016-125316

(51) Int. Cl.
*G11B 5/39* (2006.01)
*H01F 10/16* (2006.01)
(Continued)

(52) U.S. Cl.
CPC ........... *G11B 5/3909* (2013.01); *H01F 10/13* (2013.01); *H01F 10/132* (2013.01); *H01F 10/16* (2013.01);
(Continued)

(58) Field of Classification Search
None
See application file for complete search history.

(56) References Cited

U.S. PATENT DOCUMENTS 7,218,483 B2 *  5/2007  Yuasa ................... B82Y 10/00
                                                        257/E43.004
9,047,891 B1 *  6/2015  Childress ............. G11B 5/3909
(Continued)

FOREIGN PATENT DOCUMENTS

| JP | 2004-128085 | 4/2004 |
| JP | 2014-203931 | 10/2014 |

(Continued)

OTHER PUBLICATIONS

International Search Report dated Sep. 5, 2017 in International Application No. PCT/JP2017/023140.
(Continued)

*Primary Examiner* — Kevin M Bernatz
(74) *Attorney, Agent, or Firm* — Wenderoth, Lind & Ponack, L.L.P.

(57) ABSTRACT

An object of the present invention is to provide a Magneto-Resistance (MR) element showing a high Magneto-Resistance (MR) ratio and having a suitable Resistance-Area (RA) for device applications. The MR element of the present invention has a laminated structure including a first ferro-
(Continued)

magnetic layer 16, a non-magnetic layer 18, and a second ferromagnetic layer 20 on a substrate 10, wherein the first ferromagnetic layer 16 includes a Heusler alloy, the second ferromagnetic layer 20 includes a Heusler alloy, the non-magnetic layer 18 includes a I-III-VI$_2$ chalcopyrite-type compound semiconductor, and the non-magnetic layer 18 has a thickness of 0.5 to 3 nm, and wherein the MR element shows a Magneto-Resistance (MR) change of 40% or more, and has a resistance-area (RA) of 0.1 [$\Omega\mu m^2$] or more and 3 [$\Omega\mu m^2$] or less.

7 Claims, 10 Drawing Sheets

(51) Int. Cl.
*H01F 10/30* (2006.01)
*H01L 43/10* (2006.01)
*H01L 43/08* (2006.01)
*H01L 43/12* (2006.01)
*H01L 29/82* (2006.01)
*H01F 10/13* (2006.01)

(52) U.S. Cl.
CPC .............. *H01F 10/30* (2013.01); *H01L 29/82* (2013.01); *H01L 43/08* (2013.01); *H01L 43/10* (2013.01); *H01L 43/12* (2013.01)

(56) References Cited

U.S. PATENT DOCUMENTS

| | | | | |
|---|---|---|---|---|
| 9,643,385 | B1* | 5/2017 | Butler | C22C 27/00 |
| 10,755,733 | B1* | 8/2020 | Zheng | G11B 5/3906 |
| 2004/0061980 | A1* | 4/2004 | Haneda | G11B 5/3903 360/324 |
| 2007/0109693 | A1* | 5/2007 | Carey | B82Y 25/00 360/324.12 |
| 2008/0218907 | A1* | 9/2008 | Mizuno | G11B 5/59683 360/313 |
| 2010/0103565 | A1* | 4/2010 | Lou | G11C 11/1659 360/324.11 |
| 2011/0149428 | A1* | 6/2011 | Franca-Neto | G11B 5/6029 360/75 |
| 2013/0040167 | A1 | 2/2013 | Alagarsamy et al. | |
| 2014/0301136 | A1 | 10/2014 | Inokuchi et al. | |
| 2015/0177284 | A1 | 6/2015 | Fukuzawa et al. | |
| 2016/0225393 | A1 | 8/2016 | Varaprasad et al. | |
| 2017/0117458 | A1* | 4/2017 | Sonobe | H01L 43/10 |
| 2019/0088711 | A1* | 3/2019 | Shiokawa | G11C 11/18 |
| 2019/0148629 | A1* | 5/2019 | Sasaki | G11C 11/18 257/421 |
| 2019/0237119 | A1* | 8/2019 | Sasaki | G11C 11/1673 |
| 2019/0267064 | A1* | 8/2019 | Shiokawa | H01F 10/329 |
| 2019/0267540 | A1* | 8/2019 | Shiokawa | H01L 43/12 |
| 2019/0267541 | A1* | 8/2019 | Shiokawa | H01L 43/10 |
| 2019/0267542 | A1* | 8/2019 | Komura | H01L 27/222 |
| 2019/0287706 | A1* | 9/2019 | Shiokawa | H01F 10/329 |
| 2019/0288185 | A1* | 9/2019 | Shiokawa | H01L 43/10 |
| 2019/0319183 | A1* | 10/2019 | Sasaki | H01L 43/06 |
| 2019/0355401 | A1* | 11/2019 | Shiokawa | G11C 11/1659 |
| 2020/0044141 | A1* | 2/2020 | Yamada | G11C 11/161 |
| 2020/0083430 | A1* | 3/2020 | Sasaki | H01L 43/02 |
| 2020/0083434 | A1* | 3/2020 | Sasaki | H01F 10/3254 |
| 2020/0098412 | A1* | 3/2020 | Shibata | H01L 27/228 |
| 2020/0136017 | A1* | 4/2020 | Ashida | H01F 10/329 |
| 2020/0136023 | A1* | 4/2020 | Tsumita | G11C 11/1675 |
| 2020/0243752 | A1* | 7/2020 | Sasaki | H01F 10/329 |
| 2020/0251268 | A1* | 8/2020 | Nakada | G01R 33/093 |
| 2020/0259072 | A1* | 8/2020 | Ito | H01L 43/08 |
| 2020/0266336 | A1* | 8/2020 | Nakada | H01L 27/222 |
| 2020/0273511 | A1* | 8/2020 | Ashida | G11C 11/1673 |
| 2020/0278403 | A1* | 9/2020 | Shiokawa | H01L 43/04 |

FOREIGN PATENT DOCUMENTS

| | | |
|---|---|---|
| JP | 5617112 | 11/2014 |
| JP | 2015-125012 | 7/2015 |
| WO | 2012/081694 | 6/2012 |
| WO | 2015/037425 | 3/2015 |

OTHER PUBLICATIONS

T. Kitada, K. Nakamura, Y. Tanaka, S Furukawa, and T. Hatano, Dig. 59th Conf. on MMM, vols. DE-02, (2014).

H. Fukuzawa, H. Yuasa, S. Hashimoto, K. Koi, H. Iwasaki, M. Takagishi, Tanaka, and M. Sahashi: IEEE Trans. Magn. 40, 2236 (2004).

K. Shimazawa, Y. Tsuchiya, T. Mizuno, S. Hara, T. Chou, D. Miyauchi, T. Machita, T. Ayukawa, T. Ichiki, and K. Noguchi: IEEE Trans. Magn., 46, 1487 (2010).

A. M. H. R. Hakimi, N. Baberjee, A. Aziz, J. W. A. Robinson, and M. G. Blamire: Appl. Phys. Lett., 96, 102514 (2010).

T. Nakatani G, Mihajlovic, J. C. Read, Y-S. Choi, and J. Childress: Appl. Phys. Express 8, 093003 (2015).

S. Kreuzer, J. Moser, W. Wegscheider, and D. Weiss: Appl. Phys. Lett. 80, 4582 (2002).

K. Sakai, "MgO substitute barrier material for low resistance • high output magnetic tunnel junction", Jul. 15, 2016.

K. Mukaiyama et al., "Magnetic junctions using a Cu(In0.8Ga0.2)Se2 semiconductor spacer and Co2Fe(Ga0.5Ge0.5) electrodes for low-resistance devices", The 40th Annual Conference on Magnetics in Japan, 6aA-3, Sep. 2016.

Koki Mukaiyama et al., "Large magnetoresistance effect in magnetic tunnel junctions with a Cu(In0.8Ga0.2)Se2 barrier with a low resistance-area product", The 64th JSAP Spring Meeting, 14a-501-7, Mar. 14, 2017.

Notification of Reasons for Refusal dated Feb. 4, 2020 in Japanese Patent Application No. 2018-524175 with English-language translation.

Notification of Reasons for Refusal dated May 26, 2020 in corresponding Japanese Patent Application No. 2018-524175, with English translation.

* cited by examiner 1 2 3 4 5 6 GROUP

- Si   DIAMOND STRUCTURE
- GaAs   ZINCBLENDE STRUCTURE
- ZnS   ZINCBLENDE STRUCTURE
- CuGaS   CHALCOPYRITE STRUCTURE

MAGNETO-RESISTANCE ELEMENT IN WHICH I-III-VI2 COMPOUND SEMICONDUCTOR IS USED, METHOD FOR MANUFACTURING SAID MAGNETO-RESISTANCE ELEMENT, AND MAGNETIC STORAGE DEVICE AND SPIN TRANSISTOR IN WHICH SAID MAGNETO-RESISTANCE ELEMENT IS USED

TECHNICAL FIELD

The present invention relates to a Magneto-Resistance (MR) element using a I-III-VI$_2$ chalcopyrite-type compound semiconductor as a spacer material, and a method for producing the same.

The present invention also relates to a magnetoresistive random-access memory, a reading head of a hard disk, and a spin logic element using the above MR element.

BACKGROUND ART

A Magneto-Resistance (MR) element such as a magnetic tunnel junction (MTJ) or a current perpendicular to plane-giant magnetoresistance (CPP-GMR) element is an element which includes a 3-layered structure of ferromagnetic layer/non-magnetic layer/ferromagnetic layer and utilizes a phenomenon in which resistance varies significantly by the relative angle of magnetizations between two ferromagnetic layers. The MR element is expected to be applied to a magnetoresistive random-access memory (MRAM), a reading head of a hard disk drive (HDD), and a spin logic element. Thus, it is desired to develop an MR element showing a significant magnetoresistance (MR) change with a resistance-area (RA) product ranging from 0.1 to 1 $\Omega\mu m^2$. It is difficult to achieve the above benchmark both for an MTJ element and a CPP-GMR element.

The MTJ has a structure in which ferromagnetic electrodes such as CoFeB are disposed above and below a tunnel barrier layer such as thin MgO having a thickness of about 1 nm, and utilizes a tunnel magnetoresistance effect between the ferromagnet electrodes. It is an element including an MgO film having a thickness of 1 nm or more and showing a high MR ratio of more than 100%, and currently used as a reading element of a hard disk drive (HDD). However, in order to support fast readout of a high-density medium, reduction of RA is required. The thickness of a tunnel barrier layer should be reduced to 1 nm or less to decrease RA of MTJ. However, it is difficult to maintain a high MR ratio in such a small thickness range.

On the other hand, a CPP-GMR element in which all layers are composed of metals has a problem of having an insufficient RA and showing a low MR ratio. A lot of investigations have been made regarding MTJ, and MR ratio=200% and RA=10 $\Omega\mu m^2$ have been accomplished to date (see, Non Patent Literature 1). However, in a CPP-GMR element using a metal non-magnetic layer, even when a Heusler alloy, which is a material having a high spin polarization, is used, the properties are merely RA<0.1 $\Omega\mu m^2$ and the MR ratio=80%. In a CPP-GMR element, in order to further increase RA, special spacers such as current-confined-path (see, Non Patent Literature 2) and oxide (Non Patent Literatures 3 to 5) spacers may be used. However, both desired MR ratio and RA have not been accomplished concurrently.

On the other hand, examples of the method for achieving a desired RA product by an MR element include a method using semiconductor materials such as Si, GaAs, and ZnSe as a spacer, whereas oxides and non-magnetic metals are conventionally used. Band gaps of these semiconductor materials are 1 to 2 eV which is smaller than that of MgO of 7.8 eV. Thus, it is thought to be useful for reducing RA. However, growth of a semiconductor on a ferromagnetic metal is difficult, and an MR element including Fe/GaAs/Fe and showing an MR ratio of about 5% at low temperature has only been reported previously (see, Non Patent Literature 6).

High quality growth of Ge or SiGe, which is a group IV semiconductor, on a ferromagnetic material has also been reported. However, MR ratio, which is the most important in an MR element, has not been disclosed (see, Patent Literature 1). On the other hand, a perpendicular magnetic recording medium has already been proposed by the present inventors (see, Patent Literatures 2 and 3). However, in order to provide an MR element showing a high MR ratio and having a suitable RA for device applications, further improved performance has been desired.

CITATION LIST

Patent Literature

Patent Literature 1: WO 2012/081694 A
Patent Literature 2: WO 2015/037425 A
Patent Literature 3: JP 5617112 B2

Non Patent Literature

Non Patent Literature 1: T. Kitada, K. Nakamura, Y. Tanaka, S. Furukawa, and T. Hatano, Dig. 59th Conf. on MMM, Vols. DE-02, (2014).
Non Patent Literature 2: H. Fukuzawa, H. Yuasa, S. Hashimoto, K. Koi, H. Iwasaki, M. Takagishi, Y. Tanaka, and M. Sahashi: IEEE Trans. Magn. 40, 2236 (2004).
Non Patent Literature 3: K. Shimazawa, Y. Tsuchiya, T. Mizuno, S. Hara, T. Chou, D. Miyauchi, T. Machita, T. Ayukawa, T. Ichiki, and K. Noguchi: IEEE Trans. Magn., 46, 1487 (2010).
Non Patent Literature 4: A. M. H. R. Hakimi, N. Baberjee, A. Aziz, J. W. A. Robinson, and M. G. Blamire: Appl. Phys. Lett., 96, 102514 (2010).
Non Patent Literature 5: T. Nakatani G, Mihajlovic, J. C. Read, Y-S. Choi, and J. Childress: Appl. Phys. Express 8, 093003 (2015). 7. S. Kreuzer, J. Moser, W. Wegscheider, and D. Weiss: Appl. Phys. Lett. 80, 4582 (2002).
Non Patent Literature 6: S. Kreuzer, J. Moser, W. Wegscheider, and D. Weiss: Appl. Phys. Lett. 80, 4582 (2002).

SUMMARY OF INVENTION

Technical Problem

An object of the present invention is to provide an MR element showing a high MR ratio and having a suitable RA for device applications by using a chalcopyrite-type compound semiconductor as a spacer layer.

Solution to Problem

A Magneto-Resistance (MR) element of the present invention has, for example as illustrated in FIG. 1, a laminated structure including a first ferromagnetic layer 16, a non-magnetic layer 18, and a second ferromagnetic layer 20 on a substrate 10, wherein the first ferromagnetic layer 16 includes a Heusler alloy, the second ferromagnetic layer 20 includes a Heusler alloy, the non-magnetic layer 18 includes a I-III-VI$_2$ chalcopyrite-type compound semiconductor, and the non-magnetic layer 18 has a thickness of equivalent to 0.5 to 3 nm, and wherein the MR element shows a magnetoresistance (MR) change of 40% or more, and has a resistance-area (RA) of 0.1 [Ωµm$^2$] or more and 3 [Ωµm$^2$] or less.

In the MR element of the present invention, the I-III-VI$_2$ chalcopyrite-type compound semiconductor is preferably a semiconductor selected from the group consisting of Cu(In$_{1-y}$Ga$_y$)Se$_2$ (0≤y≤1), Cu(In$_{1-y}$Ga$_y$)S$_2$ (0≤y≤1), Ag(In$_{1-y}$Ga$_y$)Se$_2$ (0≤y≤1), and Ag(In$_{1-y}$Ga$_y$)S$_2$ (0≤y≤1), and more preferably Cu(In$_{1-y}$Ga$_y$)Se$_2$ (0≤y≤1).

In the MR element of the present invention, the Heusler alloy is a Co-based Heusler alloy selected from the group consisting of Co$_2$MnGa$_x$Ge$_{1-x}$ (0≤x≤1), Co$_2$MnGa$_x$Sn$_{1-x}$ (0≤x≤1), Co$_2$MnSi$_x$Ge$_{1-x}$ (0≤x≤1), Co$_2$FeGa$_x$Ge$_{1-x}$ (0≤x≤1), Co$_2$Cr$_y$Fe$_{1-y}$Ga (0≤y≤1), Co$_2$MnGe$_x$Sn$_{1-x}$ (0≤x≤1), Co$_2$Mn$_y$Fe$_{1-y}$Sn (0≤y≤1), Co$_{2-z}$Fe$_z$MnGe (0≤z≤2), Co$_2$Mn$_y$Fe$_{1-y}$Ga (0≤y≤1), Co$_2$Cr$_y$Fe$_{1-y}$Si (0≤y≤1), Co$_2$MnTi$_x$Sn$_{1-x}$ (0≤x≤1), Co$_2$MnAl$_x$Sn$_{1-x}$ (0≤x≤1), Co$_2$MnGa$_x$Si$_{1-x}$ (0≤x≤1), Co$_2$Mn$_y$Fe$_{1-y}$Si (0≤y≤1), Co$_2$MnAl$_x$Si$_{1-x}$ (0≤x≤1), Co$_2$FeGa$_x$Si$_{1-x}$ (0≤x≤1), Co$_2$FeAl$_x$Si$_{1-x}$ (0≤x≤1), Co$_2$CrAl, Co$_2$CrGa, Co$_2$MnSn, Co$_2$MnAl, Co$_2$MnGa, Co$_2$FeSi, Co$_2$FeAl, Co$_2$MnGe, Co$_2$FeGe, Co$_2$FeGa, Co$_2$TiSn, Co$_2$MnSi, Fe$_2$VAl, and Co$_2$VAl$_{55}$, in which the above-mentioned first ferromagnetic layer preferably has B2 or L2$_1$ structure, and the above-mentioned second ferromagnetic layer has B2 structure.

The Co$_2$MnGa$_x$Ge$_{1-x}$ (0≤x≤1) is preferably, but not limited to, Co$_2$MnGa$_{0.5}$Ge$_{0.5}$ or Co$_2$MnGa$_{0.25}$Ge$_{0.75}$. The Co$_2$MnGa$_x$Sn$_{1-x}$ (0≤x≤1) is preferably, but not limited to, Co$_2$MnGa$_{0.5}$Sn$_{0.5}$. The Co$_2$MnSi$_x$Ge$_{1-x}$ (0≤x≤1) is preferably, but not limited to, Co$_2$MnSi$_{0.75}$Ge$_{0.25}$ or Co$_2$MnSi$_{0.25}$Ge$_{0.75}$. The Co$_2$FeGa$_x$Ge$_{1-x}$ (0≤x≤1) is preferably, but not limited to, Co$_2$FeGa$_{0.5}$Ge$_{0.5}$. The Co$_2$Cr$_y$Fe$_{1-y}$Ga (0≤y≤1) is preferably, but not limited to, Co$_2$Cr$_{0.02}$Fe$_{0.98}$Ga. The Co$_2$MnGe$_x$Sn$_{1-x}$ (0≤x≤1) is preferably, but not limited to, Co$_2$MnGe$_{0.5}$Sn$_{0.5}$. The Co$_2$Mn$_y$Fe$_{1-y}$Ga (0≤y≤1) is preferably, but not limited to, Co$_2$Mn$_{0.95}$Fe$_{0.05}$Sn. The Co$_{2-z}$Fe$_z$MnGe (0≤z≤2) is preferably, but not limited to, Co$_{1.95}$Fe$_{0.05}$MnGe. The Co$_2$Mn$_y$Fe$_{1-y}$Ga (0≤y≤1) is preferably, but not limited to, Co$_2$Mn$_{0.5}$Fe$_{0.5}$Ga. The Co$_2$Cr$_y$Fe$_{1-y}$Si (0≤y≤1) is preferably, but not limited to, Co$_2$Cr$_{0.02}$Fe$_{0.98}$Si or Co$_2$Cr$_{0.1}$Fe$_{0.9}$Si. The Co$_2$MnTi$_x$Sn$_{1-x}$ (0≤x≤1) is preferably, but not limited to, Co$_2$MnTi$_{0.25}$Sn$_{0.75}$. The Co$_2$MnAl$_x$Sn$_{1-x}$ (0≤x≤1) is preferably, but not limited to, Co$_2$MnAl$_{0.5}$Sn$_{0.5}$. The Co$_2$MnGa$_x$Si$_{1-x}$ (0≤x≤1) is preferably, but not limited to, Co$_2$MnGa$_{0.25}$Si$_{0.75}$. The Co$_2$Mn$_y$Fe$_{1-y}$Si (0≤y≤1) is preferably, but not limited to, Co$_2$Mn$_{0.5}$Fe$_{0.5}$Si or Co$_2$Mn$_{0.6}$Fe$_{0.4}$Si. The Co$_2$MnAl$_x$Si$_{1-x}$ (0≤x≤1) is preferably, but not limited to, Co$_2$MnAl$_{0.5}$Si$_{0.5}$. The Co$_2$FeGa$_x$Si$_{1-x}$ (0≤x≤1) is preferably, but not limited to, Co$_2$FeGa$_{0.5}$Si$_{0.5}$. The Co$_2$FeAl$_x$Si$_{1-x}$ (0≤x≤1) is preferably, but not limited to, Co$_2$FeAl$_{0.5}$Si$_{0.5}$.

In the Heusler alloy, the above-described elemental compositions are typical examples of the Heusler alloy. The elemental compositions may vary somewhat from the above-described elemental compositions without problems for use in a ferromagnetic layer of an MR element.

The MR element of the present invention for use in MRAM or spin-torque oscillator element applications, in which high magnetic anisotropic properties are primarily required, preferably includes, instead of the Heusler alloy, a magnetic layer including one or more magnetic materials selected from the group consisting of:

(i) a CoCr magnetic layer having perpendicular magnetization orientation selected from the group consisting of CoCrPt, CoCrTa, CoCrTaPt, and CoCrTaNb;

(ii) an RE-TM amorphous alloy magnetic layer such as TbFeCo;

(iii) an artificial lattice magnetic layer selected from the group consisting of Co/Pd, Co/Pt, CoCrTa/Pd, FeCo/Pt, and FeCo/Ni;

(iv) a CoPt, FePt, or FePd alloy magnetic layer;

(v) a SmCo alloy magnetic layer;

(vi) a soft magnetic layer selected from the group consisting of CoFe, CoNiFe, NiFe, CoZrNb, FeN, FeSi, FeAlSi, CoFeB, and FeB; and (vii) a CoCr magnetic alloy film having in-plane magnetization orientation.

The magnetic storage device of the present invention is a magnetic storage device using the above MR element, in which spin orientation in one ferromagnetic Heusler alloy layer of the MR element is fixed and spin orientation in the other ferromagnetic Heusler alloy layer is allowed to be reversible, and electric current is passed through the MR element in the lamination direction to output a value corresponding to the spin orientation in each of the above layers.

The spin transistor of the present invention is a spin transistor using the above MR element, in which a gate voltage is applied to the chalcopyrite-type compound semiconductor layer, one of the ferromagnetic Heusler alloy layer of the above MR element is a source layer, and the other ferromagnetic Heusler alloy layer is a drain layer.

When an MR element is formed on a MgO (001) single-crystal substrate, a method for producing the MR element of the present invention includes the steps of:

forming an Ag layer and performing first heat treatment at 300° C. to 450° C. for 10 minutes to 2 hours;

forming a lower Co$_2$FeGaGe film on the Ag layer and performing a second heat treatment at 300° C. to 650° C. for 10 minutes to 2 hours;

forming a Cu(In$_{1-y}$Ga$_y$)Se$_2$ (0≤y≤1, for example y=0.2, hereinafter sometimes abbreviated as CIGS) film with a layer thickness of 0.5 to 3 nm on the lower Co$_2$FeGaGe; and forming an upper Co$_2$FeGaGe film on the Cu(In$_{1-y}$Ga$_y$)Se$_2$ and performing a third heat treatment at 270° C. to 350° C. for 10 minutes to 2 hours.

The first heat treatment improves surface flatness of the Ag layer. There are drawbacks that when the heat treatment temperature of the first heat treatment is less than 270° C., the improvement in surface flatness is insufficient, and when the temperature exceeds 450° C., the surface flatness decreases. There are also drawbacks that when the heat treatment time is less than 10 minutes, the improvement in the surface flatness is insufficient, and when the time exceeds 2 hours, the heat treatment time is unnecessarily long.

The second heat treatment is performed to order the lower Co$_2$FeGa$_{0.5}$Ge$_{0.5}$ into B2 or L2$_1$ structure. There are drawbacks that when the heat treatment temperature of the second heat treatment is less than 270° C., the ordering into the B2 structure is insufficient, and when the temperature exceeds 650° C., the structure of the layer is destructed. There are drawbacks that when the heat treatment time is less than 10 minutes, the ordering into B2 or L2$_1$ structure is insufficient, and when the time exceeds 2 hours, the heat treatment time is unnecessarily long.

The third heat treatment is performed to order the upper $Co_2FeGaGe$ into B2 structure. There are drawbacks that when heat treatment temperature of the third heat treatment is less than 270° C., the ordering into B2 structure is insufficient, and when the temperature exceeds 350° C., the structure of the layer is destructed.

Next, a crystal structure of chalcopyrite is described.

When a compound is formed from two elements which have group numbers higher and lower than a group IV element (e.g., Si and Ge) in the periodic table, in which differences in numbers between group IV and each group are the same, a certain chemical bond is formed to give a semiconductor. For example, in GaAs, which is an example of groups III-V, Ga donates three electrons from $3s^2 3p^1$ and As donates five electrons from $4s^2 4p^3$, the electrons are redistributed, and the four electrons of each atom form a hybrid orbital of $sp^3$. A groups III-V semiconductor and a group IV element are isoelectric. By using group IV as a starting point, groups II-VI and groups III-V are obtained. In addition, in the groups II-VI, when group II is substituted with two elements from group I and group III, a compound of groups I-III-$VI_2$ is obtained. Furthermore, when group I is substituted with a lattice vacancy and group II, a crystal of groups II-$III_2$-$VI_4$ is obtained. These are referred to as an adamantine family. A schematic diagram of the adamantine family is shown in FIG. 9. They are isoelectric and show semiconductor-like properties.

With respect to crystal structures, group IV forms a diamond structure, groups III-V and groups II-VI form a zincblende structure or a wurtzite structure (wurtzite structure), and groups I-III-$VI_2$ and II-IV-$V_2$ form chalcopyrite structure.

FIG. 10 is a schematic diagram of atomic arrangement illustrating a chalcopyrite-type crystal structure. The chalcopyrite structure of, for example, group I-III-$VI_2$ or II-IV-$V_2$ has a unit cell including two zincblende structures stacked along the c axis. However, the c axis is not twice as long as the a axis, and the elements form a tetrahedral system.

Advantageous Effects of Invention

The MR element of the present invention provides an MR element showing a high MR ratio and having an RA suitable for device applications.

The magnetic storage device and the spin transistor using the MR element of the present invention provide a perpendicular magnetic recording device which has a high density and a high-storage capacity and a spin transistor which is applicable to a nonvolatile logic device and the like.

DESCRIPTION OF EMBODIMENTS

In the present embodiment, one of I-III-$VI_2$ chalcopyrite-type compound semiconductors in the form of $Cu(In_{1-y}Ga_y)Se_2$ (wherein $0 \leq y \leq 1$, preferably y=0.2, hereinafter sometimes abbreviated as CIGS) is used as a spacer material in a non-magnetic layer of an MR element having a laminated structure including a first ferromagnetic layer, a non-magnetic layer, and a second ferromagnetic layer on a substrate. For example, when y is 0.2, the above CIGS becomes $Cu(In_{0.8}Ga_{0.2})Se_2$, which is a CIGS in which some In of $CuInSe_2$ are substituted with Ga. The $Cu(In_{0.8}Ga_{0.2})Se_2$ is known as a solar cell material and has a chalcopyrite-type crystal structure. Band gaps of $CuInSe_2$ and $CuGaSe_2$ are about 1.0 eV and about 1.7 eV, respectively, and vary according to amounts of substitution with Ga. A lattice constant changes from 0.56 nm to 0.58 nm by substitution with Ga. In the CIGS, y is not limited to 0.2, and may be in the range of $0 \leq y \leq 1$.

In the present embodiment, as a Heusler alloy used in the first and second ferromagnetic layers, when $Co_2FeGa_xGe_{1-x}$ ($0 \leq x \leq 1$) in which x is 0.5 is adopted, the Heusler alloys become $Co_2Fe(Ga_{0.5}Ge_{0.5})$ (hereinafter, sometimes referred as CFGG). A lattice constant of the Heusler alloy is 0.573 nm, resulting in particularly good lattice matching to $Cu(In_{0.8}Ga_{0.2})Se_2$. There has been no report to date on MTJ or CPP-GMR in which $Cu(In_{0.8}Ga_{0.2})Se_2$ is used as a spacer.

EXAMPLES

Results of Experiments

Figure 1:
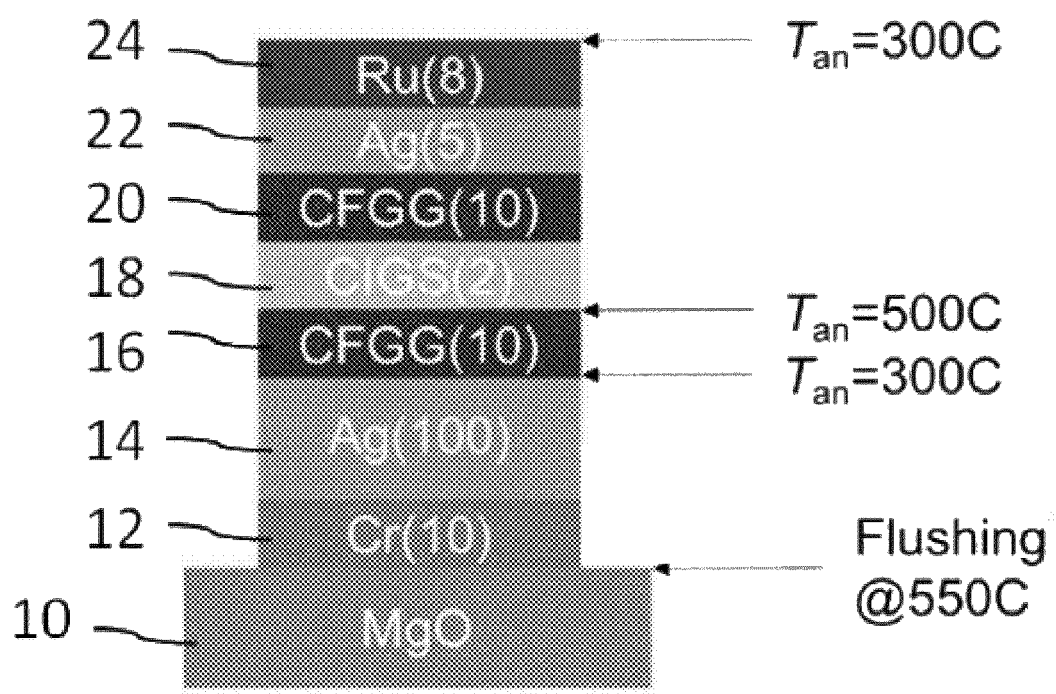
FIG. 1 is a schematic diagram of layers of an MR element using CIGS according to an example of the present invention.

FIG. 1 shows a structure of layers of an MR element produced. The structure of layers is MgO (001) substrate/Cr (10 nm)/Ag (100 nm)/CFGG (10 nm)/CIGS (2 nm)/CFGG (10 nm)/Ru (8 nm). All layers were formed at room temperature.

In steps for production, the MgO (001) single-crystal substrate was subjected to heat flushing in a sputter chamber before layer formation at 550° C. for 1 hour. After the Ag layer was formed, surface flatness of the Ag was improved by heat treatment at 300° C. After the lower CFGG layer was formed, heat treatment was performed at 500° C. to order the lower CFGG into $L2_1$ structure. After all the layers were formed, heat treatment was performed at 300° C. for ordering the upper CFGG.

Structure of a multilayer film was analyzed using a transmission electron microscope (TEM). Transport properties were analyzed by a four probe method. An MR element was prepared by micromachining using an electron-beam lithography, Ar ion milling, and lift off. A pillar prepared was elliptical. Some pillars having sizes of 200*100 nm² to 400*200 nm² were provided.

Figure 2:
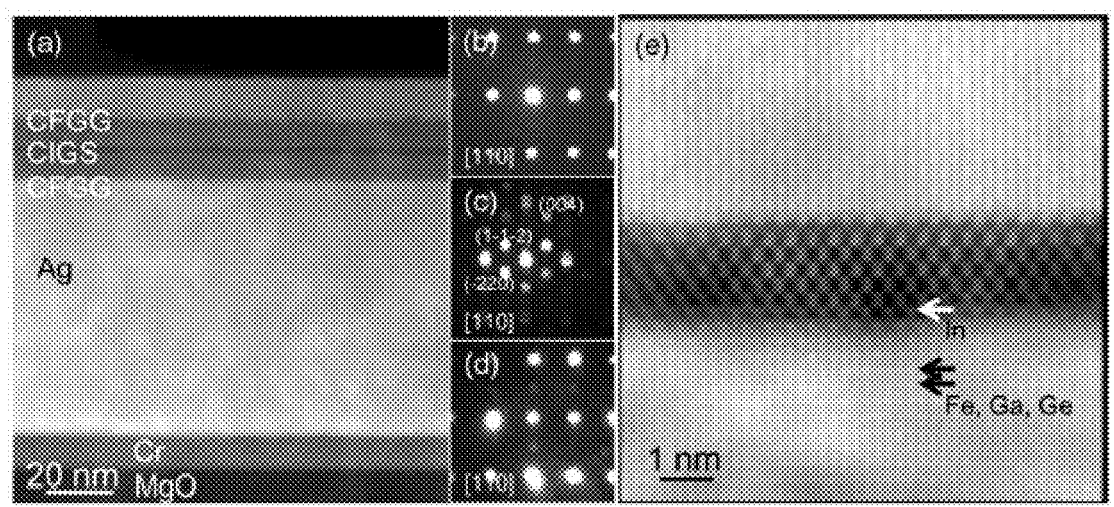
FIG. 2 is cross-sectional images of a multilayer film using CIGS according to an example of the present invention, including (a) a HAADF-STEM image, (b) a nano-beam electron diffraction image of an upper $Co_2FeGa_{0.5}Ge_{0.5}$ (hereinafter, sometimes abbreviated as CFGG), (c) a nano-beam electron diffraction image of CIGS, (d) a nano-beam electron diffraction image of a lower CFGG, and (e) a high-resolution HAADF-STEM image.

FIG. 2 shows HAADF-STEM images and nano-beam electron diffraction images of the multilayer film produced. A layered structure is clearly observed in the HAADF-STEM image in FIG. 2(a). It is recognized from the nano-beam electron diffraction images of FIG. 2(b) to FIG. 2(d) that the upper CFGG has B2 structure, the lower CFGG has $L2_1$ structure, and the CIGS has chalcopyrite structure. These layers have grown epitaxially and have an orientation relationship of $(001)[110]_{CFGG}//(001)[110]_{CIGS}$. A high-resolution HAADF-STEM image is shown in FIG. 2 (e). Periodic changes in contrast corresponding to the B2 and $L2_1$ structures of the upper and lower CFGG layers are observed. Misfit dislocation is not observed in the CFGG/CIGS interface, which shows that lattice matching is remarkably good.

Figure 3:
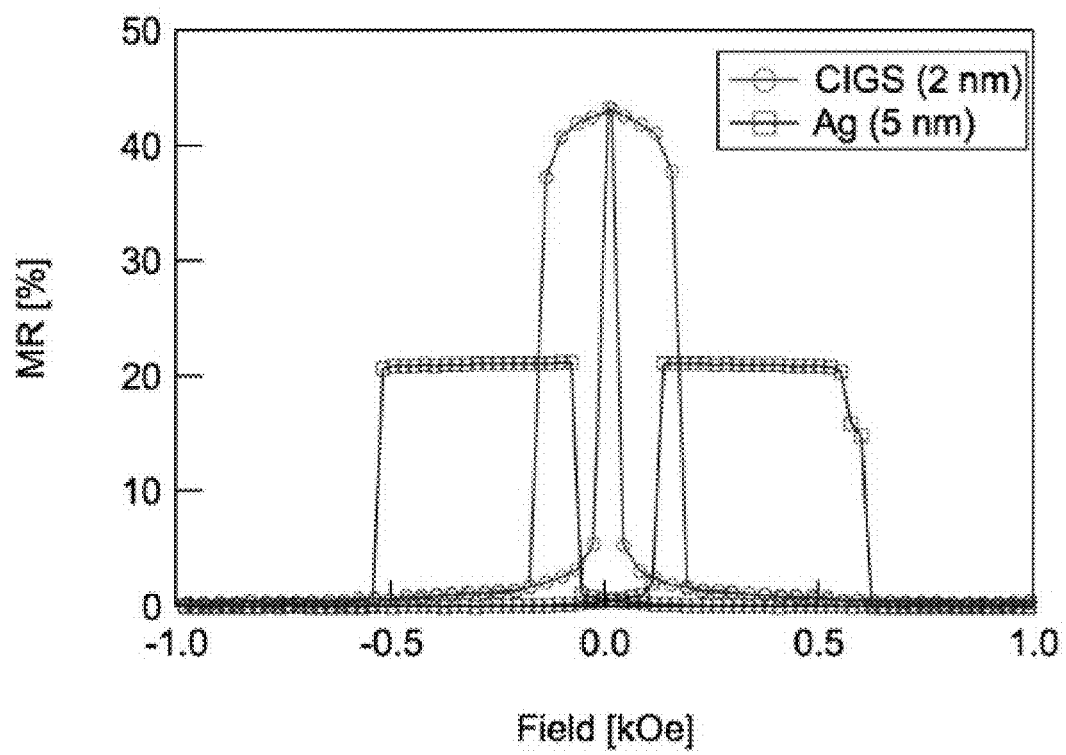
FIG. 3 shows an MR curve of a CFGG/CIGS/CFGG-MR element (open circle) and a CFGG/Ag/CFGG-CPP-GMR element (open square) according to an example of the present invention at room temperature.

FIG. 3 shows a representative MR curve. Open circles indicate MRs of the CIGS spacer (2 nm) and open squares indicate those of an Ag spacer (5 nm). The Ag spacer is shown as a reference. An element including the Ag spacer shows an MR ratio of 20%. On the other hand, an element including the CIGS spacer shows a significantly high MR ratio of 40%.

Figure 4:
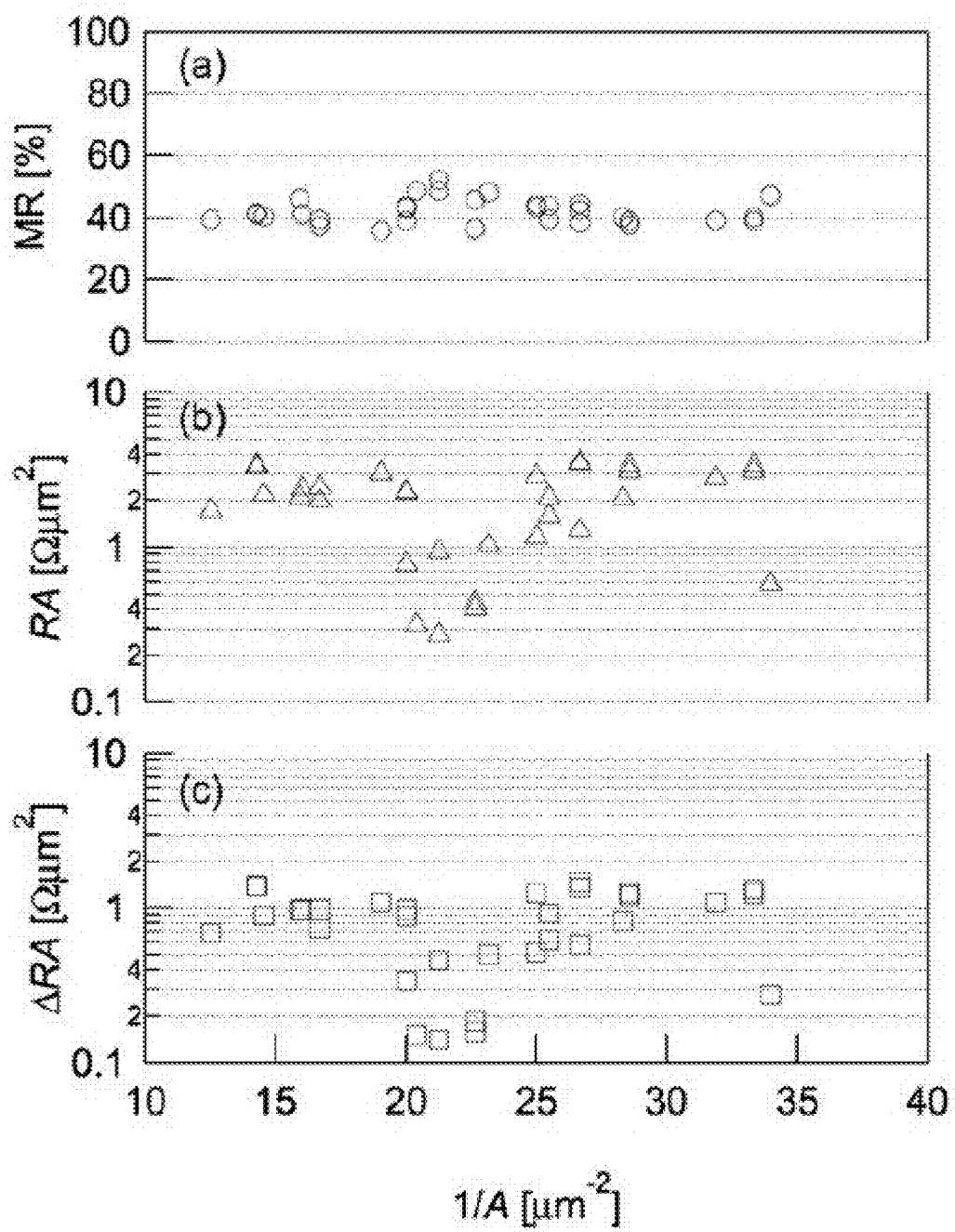
FIG. 4 is a graph showing dependencies of MR ratio, RA, and ARA of a CFGG/CIGS/CFGG-MR element according to an example of the present invention on the inverse of a pillar area ($A^{-1}$) at room temperature.

FIG. 4 shows a graph of MR ratio, RA, and ARA versus the inverse of a pillar area $(A^{-1})$. The measurement was conducted at room temperature. Although RA varies from 0.1 to 3 [$\Omega\mu m^2$], MR ratio is about 40%. Although the reason for the variation of RA is not clear, it can be found that preferred RA for application to a reading element of HDD and MRAM was obtained.

Figure 5:
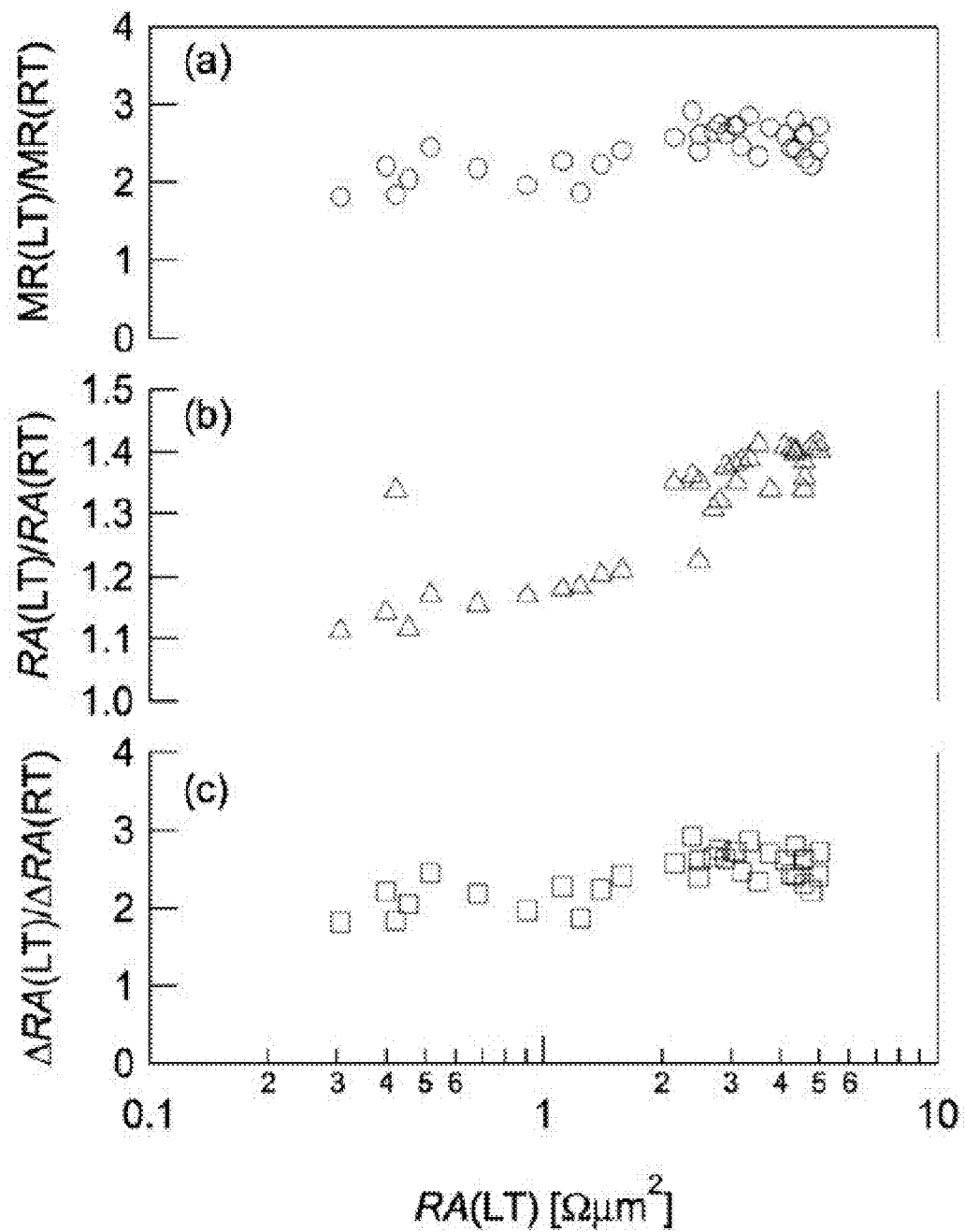
FIG. 5 is a graph showing dependencies of Magneto-Resistance ratio, RA, and ARA of a CFGG/CIGS/CFGG-MR element according to an example of the present invention on the inverse of a pillar area ($A^{-1}$) at low temperature.

FIG. 5 shows temperature dependencies of Magneto-Resistance ratio, RA, and ΔRA. MR ratios exceed 100% at 8K. There were about 10 to 20% increases in RA at low temperature, which shows that the increases in MR ratios at low temperature were due to increases in ΔRA. The decreases in RA with falling temperature represent that an electron transport mechanism of the CIGS spacer is a tunneling type. Thus, it is thought that the electron transport mechanism is different from that of the CPP-GMR element.

Figure 6:
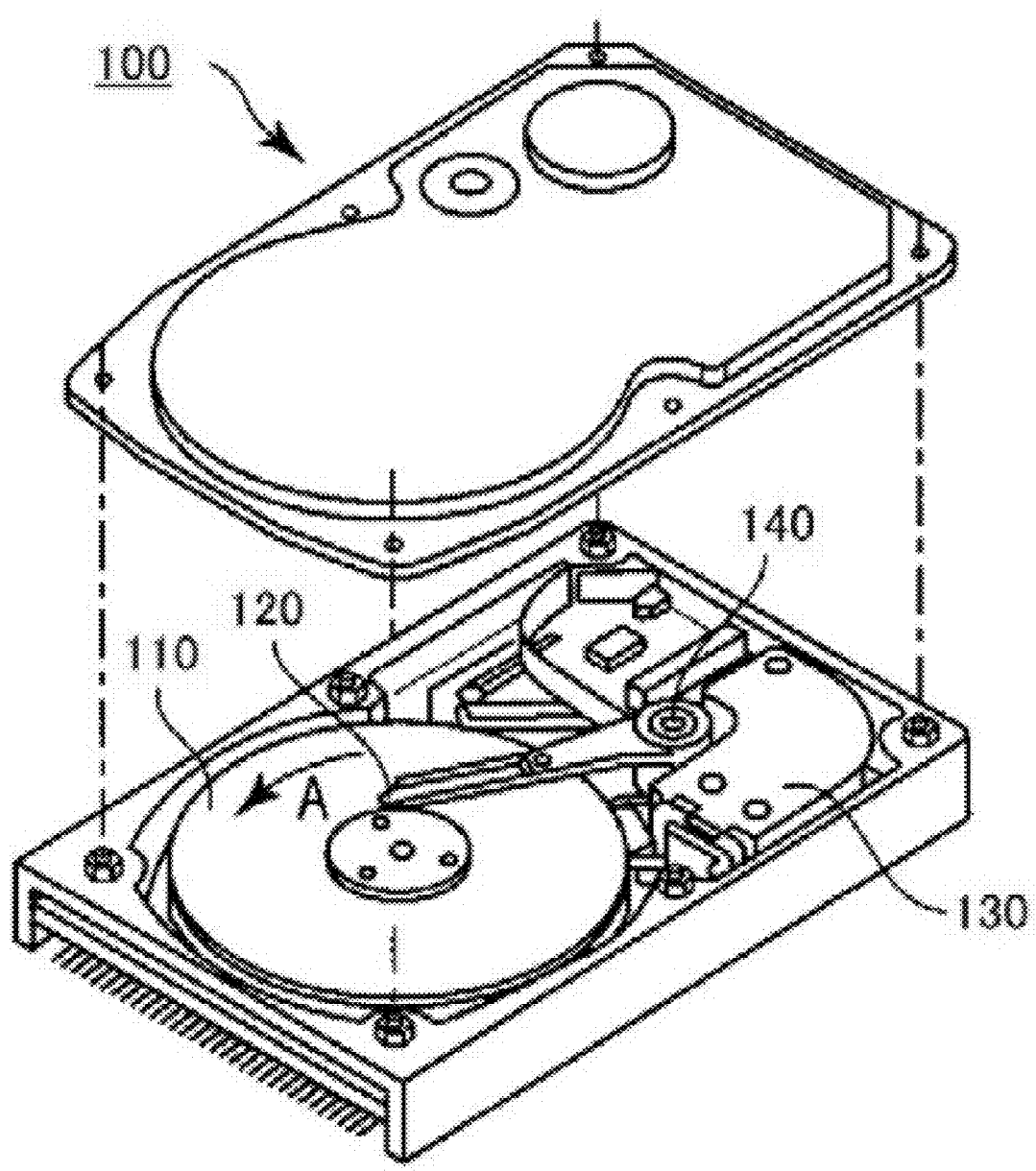
FIG. 6 is a schematic view of an example of a magnetic recording and reading device which can be equipped with a magnetic head equipped with an MR element of the present invention.

FIG. 6 is a schematic oblique view of the principal part illustrating a simplified construction of a magnetic recording and reading device which can be equipped with a magnetic head equipped with an MR element of the present invention. In FIG. 6, a magnetic recording and reading device 100 is a device having a structure using a rotary actuator. In the Figure, a recording media disk 110 rotates in the direction of the arrow A by a motor (not shown) which is mounted on a spindle 140 and responds to a control signal from a motor control unit (not shown). The magnetic recording and reading device 100 may have two or more media disks 110.

Figure 7:
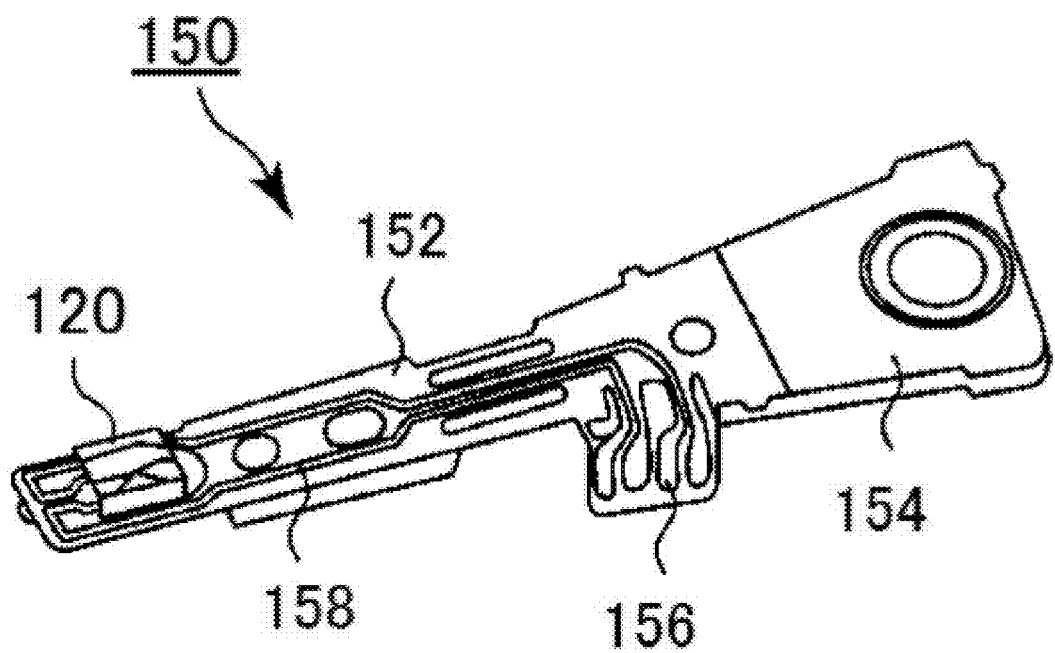
FIG. 7 is a schematic view of an example of a magnetic head assembly which is equipped with an MR element of the present invention.

A schematic view illustrating an example of a magnetic head assembly equipped with an MR element of the present invention is provided by FIG. 7.

FIG. 7 is an enlarged oblique view of a part of the magnetic head assembly between an actuator arm 154 and the end, which is viewed from the disk side. That is, a magnetic head assembly 150 has the actuator arm 154 having, for example, a bobbin portion supporting a drive coil or the like, and one end of the actuator arm 154 is connected with a suspension 152.

A head slider 120 which records and reads data stored in a media disk 110 shown in FIG. 6 is mounted on the end of a suspension 152 which has a form of thin plate as shown in FIG. 7. Herein, the head slider 120 is equipped with, for example, a magnetic head equipped with an MR element of the present invention in the vicinity of the end of the head slider 120.

When the media disk 110 rotates, the Air Bearing Surface (ABS) of the head slider 120 is maintained above the surface of the media disk 110 with a predetermined flying height. Alternatively, the slider may be a so-called "contact-type" in which the slider comes in contact with the media disk 110.

The suspension 152 is connected to one end of an actuator arm 154 having, for example, a bobbin portion (not shown) which supports a drive coil. The other end of the actuator arm 154 is equipped with a voice coil motor 130 which is a type of linear motor. The voice coil motor 130 includes a drive coil (not shown) wound around a bobbin portion of the actuator arm 154 and a magnetic circuit (not shown) composed of a permanent magnet and an opposed yoke which are placed so as to sandwich the coil and face each other.

The actuator arm 154 is supported with ball bearings (not shown) placed on the spindle 140, and can freely rotate and slide by the voice coil motor 130.

The suspension 152 includes a lead wire 158 for writing and reading a signal. The lead wire 158 and each electrode of a magnetic head mounted on the head slider 120 are electrically connected. The reference sign 156 in the figure represents an electrode pad of the magnetic head assembly 150.

Figure 8:
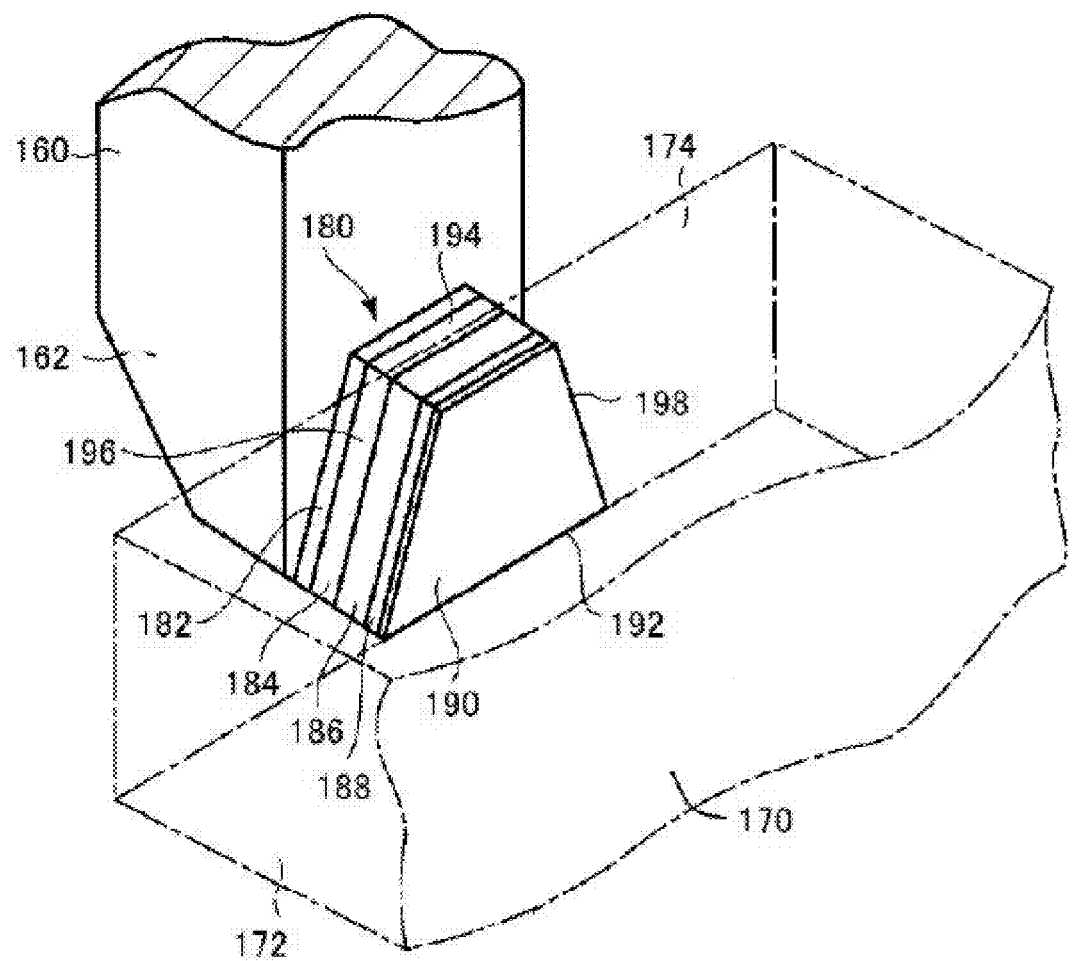
FIG. 8 is a schematic view of an example of a magnetic head equipped with an MR element of the present invention, in which an enlarged view of a tip of a main magnetic pole and a high-frequency oscillator (a spin-torque oscillator) is provided.
Figure 9:
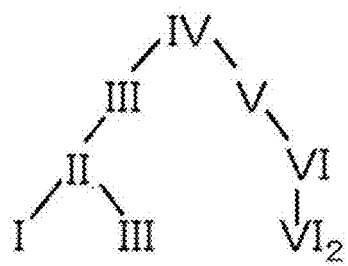
FIG. 9 is a family tree of an adamantine family.
Figure 10:
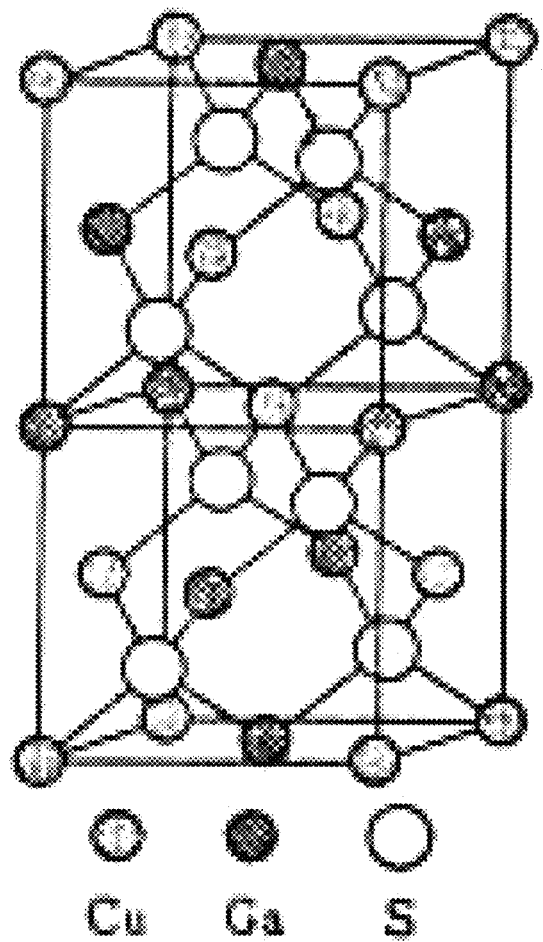
FIG. 10 is a schematic diagram of atomic arrangement illustrating a chalcopyrite-type crystal structure

FIG. 8 is a schematic oblique view illustrating a main magnetic pole and a high-frequency oscillator (a spin-torque oscillator). As shown in FIG. 8, a spin-torque oscillator 180 is placed between a tip 162 of a main magnetic pole 160 and a leading end surface 174 of an auxiliary magnetic pole 170. The spin-torque oscillator 180 includes a primary layer 182 composed of a non-magnetic conductive layer, a spin injection layer (first magnetic layer) 184, an intermediate layer 186 (a non-magnetic layer), an oscillation layer (second magnetic layer) 188, and a capping layer 190 composed of a non-magnetic conductive layer, which are stacked from the main magnetic pole 160 toward the auxiliary magnetic pole 170 in the order. The oscillation layer 188 is composed of soft magnetic FeCoNi having a high saturation flux density of 2 T. The intermediate layer 186 is composed of Cu having a long spin diffusion length, and the spin injection layer 184 is composed of an artificial lattice of Co/Ni having a high coercive force and a high spin polarization. Although FIG. 8 illustrates an example stacked in the order of a spin injection layer 184, an intermediate layer 186, and an oscillation layer 188, the order of stacking may be an oscillation layer, an intermediate layer, and a spin injection layer.

In the intermediate layer 186, a material having a high spin transmission, such as Au or Ag may be used. The intermediate layer 186 preferably has a layer thickness of that of monoatomic layer to 3 nm. This enables control of a switched connection between the spin injection layer 184 and the oscillation layer 188 to give an optimal value.

In the spin injection layer 184, materials having a superior perpendicular orientation, for example, CoCr magnetic layers having a magnetization orientation perpendicular to the layers, such as CoCrPt, CoCrTa, CoCrTaPt, and CoCrTaNb; RE-TM amorphous alloy magnetic layers such as TbFeCo;

artificial lattice magnetic layers such as Co/Pd, Co/Pt, CoCrTa/Pd, FeCo/Pt, and FeCo/Ni; alloy magnetic layers such as CoPt and FePt; SmCo alloy magnetic layers; soft magnetic layers having a relatively high saturation flux density and magnetic anisotropy in the in-plane direction of the layer, such as CoFe, CoNiFe, NiFe, CoZrNb, FeN, FeSi, and FeAlSi; Heusler alloys selected from the group consisting of CoFeSi, CoMnSi, and CoMnAl, and the like; and CoCr magnetic alloy films having in-plane magnetization orientation can be suitably used. In addition, two or more of the above materials may be stacked and the resulting laminated material may be used.

In the oscillation layer 188, a laminated material of Fe, Co, Ni, an alloy of these elements, or an artificial lattice including a combination thereof, and various materials which can be used in the above spin injection layer 184 may be used. In addition, in the oscillation layer 188, a FeCo alloy to which at least one of Al, Si, Ge, Ga, Mn, Cr, and B is added may be used. This enables control of, for example, saturation flux densities, anisotropic magnetic fields, and spin torque transmission efficiencies of the oscillation layer 188 and the spin injection layer 184.

The layer thickness of the oscillation layer 188 is preferably 5 to 20 nm, and the layer thickness of the spin injection layer 184 is preferably 2 to 60 nm.

A bottom surface 192 of the spin-torque oscillator 180 is exposed at a disk-facing surface (not shown), and mounted at about the same height of the tip surface of the main magnetic pole 160 above the surface of a magnetic disk (not shown). That is, the bottom surface 192 of the spin-torque oscillator 180 is flush with the disk-facing surface of a slider, and approximately parallel to the surface of the magnetic disk. The spin-torque oscillator 180 is the most distant from the disk-facing surface, and has a top surface 194 extending approximately parallel to the bottom surface 192 and two lateral surfaces 196 and 198 extending from the lower end surface to the upper end surface.

At least one lateral surface, for example two lateral surfaces 196 and 198 in this figure, inclines from vertical direction to the disk-facing surface toward the center of tracks, that is, inclines inward. The surface of the spin-torque oscillator 180 facing the main magnetic pole 160 is a symmetrical trapezoid which is parallel to the width direction of the tracks.

In the spin-torque oscillator 180, when a voltage is applied between the main magnetic pole 160 and the auxiliary magnetic pole 170 from a power supply (not shown) according to a control signal by a control circuit board, a direct current is passed through the spin-torque oscillator 180 in the film thickness direction. The current can rotate magnetization of the oscillation layer 188 of the spin-torque oscillator 180, leading to generation of a high-frequency magnetic field. Accordingly, the spin-torque oscillator 180 applies the high-frequency magnetic field to a recording layer of a magnetic disk. Thus, the auxiliary magnetic pole 170 and the main magnetic pole 160 act as electrodes which apply current vertically to the spin-torque oscillator 180.

Although the above examples show a magnetic tunnel junction element having a laminated structure including a first ferromagnetic layer, a non-magnetic layer, and a second ferromagnetic layer on a substrate, in which $Cu(In_{0.8}Ga_{0.2})Se_2$ is used in the non-magnetic layer and $Co_2Fe(Ga_{0.5}Ge_{0.5})$ is used in the first and second ferromagnetic layers, the present invention is not limited thereto. Of course, other $I\text{-}III\text{-}VI_2$ chalcopyrite-type compound semiconductors may be used in the non-magnetic layer, and other Heusler alloys and other ferromagnetic materials may be used in the first and second ferromagnetic layers.

INDUSTRIAL APPLICABILITY

The present invention provides an MR element showing a significant MR change and having a resistance-area of about 0.1 to 3 $\Omega\mu m^2$. Thus, the MR element can be applied to a magnetoresistive random-access memory (MRAM), a reading head of a hard disk drive (HDD), and a spin logic element.

REFERENCE SIGNS LIST

100 MAGNETIC RECORDING AND READING DEVICE
110 RECORDING MEDIA DISK
120 HEAD SLIDER
130 VOICE COIL MOTOR
140 SPINDLE
150 MAGNETIC HEAD ASSEMBLY
160 MAIN MAGNETIC POLE
170 AUXILIARY MAGNETIC POLE
180 SPIN-TORQUE OSCILLATOR

The invention claimed is:

1. A Magneto-Resistance (MR) element having a laminated structure comprising a first ferromagnetic layer, a non-magnetic layer, and a second ferromagnetic layer on a substrate, wherein
the first ferromagnetic layer comprises a Heusler alloy,
the second ferromagnetic layer comprises a Heusler alloy,
the non-magnetic layer comprises a $I\text{-}III\text{-}VI_2$ chalcopyrite-type compound semiconductor, and the non-magnetic layer has a thickness of 0.5 to 3 nm, and
the MR element shows a magnetoresistance (MR) change of 40% or more, and has a resistance-area (RA) of 0.1 [$\Omega\mu m^2$] or more and 3 [$\Omega\mu m^2$] or less.

2. The MR element according to claim 1, wherein the $I\text{-}III\text{-}VI_2$ chalcopyrite-type compound semiconductor is one of the semiconductors selected from the group consisting of $Cu(In_{1-y}Ga_y)Se_2$ ($0 \le y \le 1$), $Cu(In_{1-y}Ga_y)S_2$ ($0 \le y \le 1$), $Ag(In_{1-y}Ga_y)Se_2$ ($0 \le y \le 1$), and $Ag(In_{1-y}Ga_y)S_2$ ($0 \le y \le 1$).

3. The MR element according to claim 1, wherein the Heusler alloy is a Co-based Heusler alloy selected from the group consisting of $Co_2MnGa_xGe_{1-x}$ ($0 \le x \le 1$), $Co_2MnGa_xSn_{1-x}$ ($0 \le x \le 1$), $Co_2MnSi_xGe_{1-x}$ ($0 \le x \le 1$), $Co_2FeGa_xGe_{1-x}$ ($0 \le x \le 1$), $Co_2Cr_yFe_{1-y}Ga$ ($0 \le y \le 1$), $Co_2MnGe_xSn_{1-x}$ ($0 \le x \le 1$), $Co_2Mn_yFe_{1-y}Sn$ ($0 \le y \le 1$), $Co_{2-z}Fe_zMnGe$ ($0 \le z \le 2$), $Co_2Mn_yFe_{1-y}Ga$ ($0 \le y \le 1$), $Co_2Cr_yFe_{1-y}Si$ ($0 \le y \le 1$), $Co_2MnTi_xSn_{1-x}$ ($0 \le x \le 1$), $Co_2MnAl_xSn_{1-x}$ ($0 \le x \le 1$), $Co_2MnGa_xSi_{1-x}$ ($0 \le x \le 1$), $Co_2Mn_yFe_{1-y}Si$ ($0 \le y \le 1$), $Co_2MnAl_xSi_{1-x}$ ($0 \le x \le 1$), $Co_2FeGa_xSi_{1-x}$ ($0 \le x \le 1$), $Co_2FeAl_xSi_{1-x}$ ($0 \le x \le 1$), $Co_2CrAl$, $Co_2CrGa$, $Co_2MnSn$, $Co_2MnAl$, $Co_2MnGa$, $Co_2FeSi$, $Co_2FeAl$, $Co_2MnGe$, $Co_2FeGe$, $Co_2FeGa$, $Co_2TiSn$, $Co_2MnSi$, $Fe_2VAl$, and $Co_2VAl_{55}$, the first ferromagnetic layer has B2 or $L2_1$ structure, and the second ferromagnetic layer has B2 structure.

4. A Magneto-Resistance (MR) element having a laminated structure comprising a first ferromagnetic layer, a non-magnetic layer, and a second ferromagnetic layer on a substrate, wherein
the first ferromagnetic layer comprises one or more magnetic materials selected from the group consisting of:
(i) a CoCr magnetic layer having perpendicular magnetization orientation selected from the group consisting of CoCrPt, CoCrTa, CoCrTaPt, and CoCrTaNb;

(ii) an RE-TM amorphous alloy magnetic layer;
(iii) an artificial lattice magnetic layer selected from the group consisting of Co/Pd, Co/Pt, CoCrTa/Pd, FeCo/Pt, and FeCo/Ni;
(iv) a CoPt, FePt, or FePd alloy magnetic layer;
(v) a SmCo alloy magnetic layer;
(vi) a soft magnetic layer selected from the group consisting of CoFe, CoNiFe, NiFe, CoZrNb, FeN, FeSi, FeAlSi, CoFeB, and FeB; and
(vii) a CoCr magnetic alloy film having in-plane magnetization orientation, the second ferromagnetic layer comprises one or more magnetic materials selected from the group consisting of:
(i) a CoCr magnetic layer having perpendicular magnetization orientation selected from the group consisting of CoCrPt, CoCrTa, CoCrTaPt, and CoCrTaNb;
(ii) an RE-TM amorphous alloy magnetic layer;
(iii) an artificial lattice magnetic layer selected from the group consisting of Co/Pd, Co/Pt, CoCrTa/Pd, FeCo/Pt, and FeCo/Ni;
(iv) a CoPt, FePt, or FePd alloy magnetic layer;
(v) a SmCo alloy magnetic layer;
(vi) a soft magnetic layer selected from the group consisting of CoFe, CoNiFe, NiFe, CoZrNb, FeN, FeSi, FeAlSi, CoFeB, and FeB; and
(vii) a CoCr magnetic alloy film having in-plane magnetization orientation, the non-magnetic layer comprises a I-III-VI$_2$ chalcopyrite-type compound semiconductor, and the non-magnetic layer has a thickness of 0.5 to 3 nm, and
the MR element shows a magnetoresistance (MR) change of 40% or more, and has a resistance-area (RA) of 0.1 [$\Omega\mu m^2$] or more and 3 [$\Omega\mu m^2$] or less.

5. A magnetic storage device using the MR element according to claim 1, wherein
spin orientation in one ferromagnetic Heusler alloy layer of the MR element is fixed and spin orientation in the other ferromagnetic Heusler alloy layer is allowed to be reversible, and electric current is passed through the MR element in the lamination direction to output a value corresponding to the spin orientation in each of the layers.

6. A spin transistor using the MR element according to claim 1, wherein
a gate voltage is applied to the chalcopyrite-type compound semiconductor layer, one of the ferromagnetic Heusler alloy layer of the MR element is a source layer, and the other ferromagnetic Heusler alloy layer is a drain layer.

7. A method for producing a Magneto-Resistance (MR) element comprising the steps of:
forming an Ag layer on a MgO (001) single-crystal substrate and performing a heat treatment at 300° C. to 450° C. for 10 minutes to 2 hours;
forming a lower $Co_2FeGa_{0.5}Ge_{0.5}$ film on the Ag layer and performing heat treatment at 270° C. to 550° C. for 10 minutes to 2 hours to order the lower $Co_2FeGa_{0.5}Ge_{0.5}$ into B2 or $L2_1$ structure;
forming 0.5 to 3 nm of a $Cu(In_{0.8}Ga_{0.2})Se_2$ film on the lower $Co_2FeGa_{0.5}Ge_{0.5}$; and
forming an upper $Co_2FeGa_{0.5}Ge_{0.5}$ film on the $Cu(In_{0.8}Ga_{0.2})Se_2$ and performing heat treatment at 270° C. to 350° C. for 10 minutes to 2 hours to order the upper $Co_2FeGa_{0.5}Ge_{0.5}$ wherein the MR element shows a magnetoresistance (MR) change of 40% or more, and has a resistance-area (RA) of 0.1 [$\Omega\mu m^2$] or more and 3 [$\Omega\mu m^2$] or less.

* * * * *